United States Patent
Yoo

[19]

[11] Patent Number: 5,931,349
[45] Date of Patent: *Aug. 3, 1999

[54] VISCOUS FLUID DISCHARGING APPARATUS FOR MANUFACTURING SEMICONDUCTORS HAVING A REMOVABLE BUBBLE CAPTURING PORTION

[75] Inventor: Seung-Seok Yoo, Taegu-si, Rep. of Korea

[73] Assignee: LG Semicon, Ltd., Chungcheongbuk-do, Rep. of Korea

[ * ] Notice: This patent issued on a continued prosecution application filed under 37 CFR 1.53(d), and is subject to the twenty year patent term provisions of 35 U.S.C. 154(a)(2).

[21] Appl. No.: 08/644,011

[22] Filed: May 9, 1996

[30] Foreign Application Priority Data

May 9, 1995 [KR] Rep. of Korea .......................... 95-9688

[51] Int. Cl.$^6$ ....................................................... B67D 5/06
[52] U.S. Cl. ................................. 222/146.5; 222/189.06; 222/190; 222/527; 137/171; 96/155
[58] Field of Search ............................... 137/171; 96/155; 222/146.2, 146.5, 189.06, 189.11, 190, 527

[56] References Cited

U.S. PATENT DOCUMENTS

| | | | |
|---|---|---|---|
| 2,597,699 | 5/1952 | Bauer | 137/171 X |
| 3,476,111 | 11/1969 | Matheson | 222/527 X |
| 3,952,765 | 4/1976 | Kimura | 137/171 |
| 4,388,944 | 6/1983 | Honma et al. | 137/171 |
| 4,921,147 | 5/1990 | Poirier | 222/527 |

*Primary Examiner*—Kenneth Bomberg
*Attorney, Agent, or Firm*—Loudermilk & Associates

[57] ABSTRACT

A viscous fluid discharging apparatus is provided for removing air bubbles introduced during the passing of the viscous fluid before being supplied to the substrate. A viscous fluid discharging apparatus according to the present invention includes a viscous fluid storing container, a viscous fluid supplying pump, a viscous fluid filter, and a viscous fluid discharging mechanism provided with a final air bubble filtering means. The fluid material discharging mechanism includes a connecting portion formed on an end of a temperature adjusting mechanism connected to an outlet of the fluid material supplying pump, and a discharging gun. The discharging gun has a sealed joining portion for being sealed and joined to the connecting portion, an air bubble capturing portion for capturing air bubbles from within the viscous fluid, and a viscous fluid path for moving the viscous fluid to an outlet in a sealed state.

16 Claims, 3 Drawing Sheets

VISCOUS FLUID DISCHARGING APPARATUS FOR MANUFACTURING SEMICONDUCTORS HAVING A REMOVABLE BUBBLE CAPTURING PORTION

FIELD OF THE INVENTION

The present invention relates to viscous fluid discharging apparatus in which air bubbles are restrained during the discharging of a viscous fluid.

BACKGROUND OF THE INVENTION

Semiconductor manufacturing equipment, for example a photoresist coating apparatus, has a discharging gun for discharging a fluid having a certain level of viscosity. If a fluid having a viscosity such as a photoresist contains air bubbles during discharging, the fluid may cause a coating defect. As illustrated in FIG. 1, a conventional viscous fluid discharging apparatus includes storage container 1 for containing and storing a viscous fluid, viscous fluid pump 2 for supplying the viscous fluid from storage container 1, viscous fluid filter 3 connected to an outlet of viscous fluid pump 2 for filtering off impurity materials and air bubbles contained in the viscous fluid, and viscous fluid discharging mechanism 4 for supplying the viscous fluid to relevant regions.

Particularly, viscous fluid discharging mechanism 4 typically has a sectional constitution as illustrated in FIG. 2. Viscous fluid discharging mechanism 4 includes a temperature adjusting means having path 21 for temperature adjusting fluid 22 on the outside of discharging gun 20, for maintaining the viscous fluid at a certain temperature range when it is discharging from discharging gun 20.

For example, to look into a process for spreading photoresist onto a substrate, if a carrier containing a wafer is loaded to a wafer supplying portion, then the wafer automatically is moved to a photoresist coating section, with the result that the wafer is mounted on a vacuum chuck. Consequently, the wafer is rotated, while the viscous fluid supplying pump is activated. Sometimes, the pump is activated in a state with the wafer being stopped without rotation. When the viscous fluid supplying pump is activated, the viscous fluid is sucked up from the viscous fluid storing container to pass through the viscous fluid supplying pump, the viscous fluid filter and the final viscous fluid discharging mechanism to be discharged so as to coat the wafer.

In this process, when the viscous fluid together with residue air bubbles passes through the viscous fluid supplying pump, most of the air bubbles are removed by the viscous fluid filter. However, part of air bubbles 25 pass through the viscous fluid filter, or air can be introduced into the viscous fluid due to the fact that the sealing of the joining portion of the viscous fluid discharging apparatus is not perfect. In this case, there is no further means for removing the air bubbles, and, therefore, the viscous fluid containing the air bubbles is discharged to the wafer, with the result that coating defects are produced.

SUMMARY OF THE INVENTION

The present invention is intended to address the above-described disadvantages of the conventional technique.

Therefore, it is an object of the present invention to provide a viscous fluid discharging apparatus in which an additional means is installed for removing air bubbles introduced during the passing of the viscous fluid before being supplied to the substrate, so that the finally supplied viscous fluid contains minimal air bubbles.

In achieving the above and other objects, a viscous fluid discharging apparatus according to the present invention includes a viscous fluid storing container, a viscous fluid supplying pump, a viscous fluid filter, and a viscous fluid discharging mechanism provided with a final air bubble filtering means.

The fluid material discharging mechanism includes a connecting portion formed on an end of a temperature adjusting mechanism connected to an outlet of the fluid material supplying pump, and a discharging gun. The discharging gun has a sealed joining portion for being sealed and joined to the connecting portion, an air bubble capturing portion for capturing air bubbles from within the viscous fluid, and a viscous fluid path for moving the viscous fluid to an outlet in a sealed state.

The sealed joining portion includes a tightening band for joining the viscous fluid path to the viscous fluid outlet, and the air bubble capturing portion includes a space forming portion on the upper portion of the viscous fluid path to form a plurality of small spaces.

BRIEF DESCRIPTION OF THE DRAWINGS

The above objects and other advantages of the present invention will become more apparent by describing in detail the preferred embodiments of the present invention with reference to the attached drawings in which.

DESCRIPTION OF THE PREFERRED EMBODIMENTS

Figure 1:
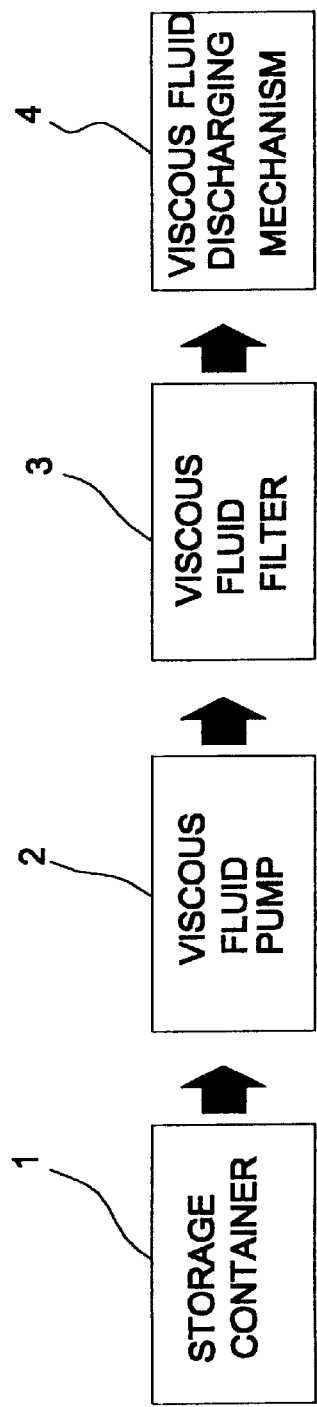
FIG. 1 is a block diagram illustrating the Constitution of a conventional viscous fluid discharging apparatus.
Figure 2:
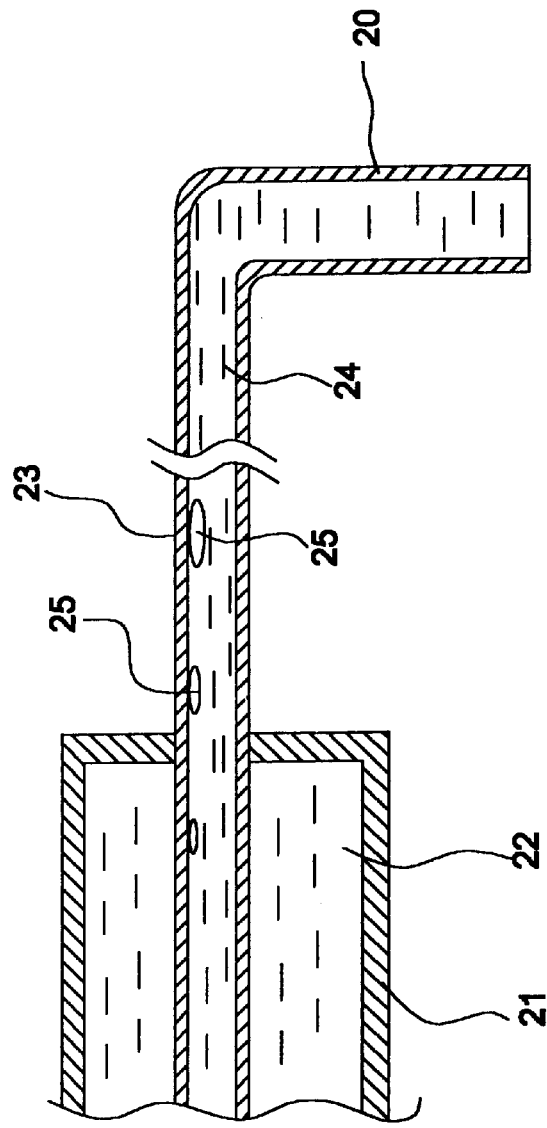
FIG. 2 is a sectional view illustrating the constitution of a viscous fluid discharging mechanism of a conventional viscous fluid discharging apparatus.
Figure 3:
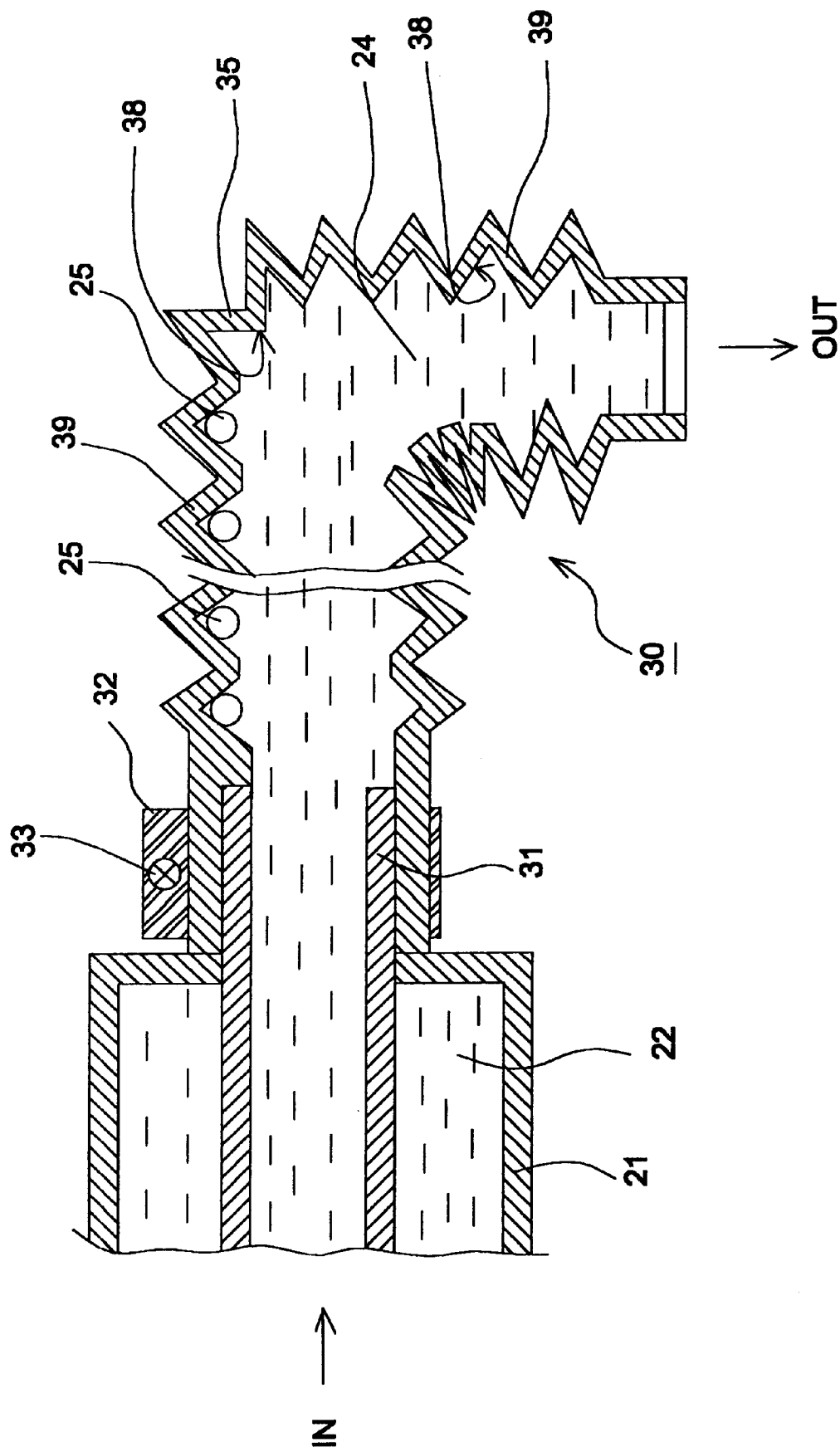
FIG. 3 is a sectional view of a viscous fluid discharging mechanism of a viscous fluid discharging apparatus according to the present invention.
Figure 4:
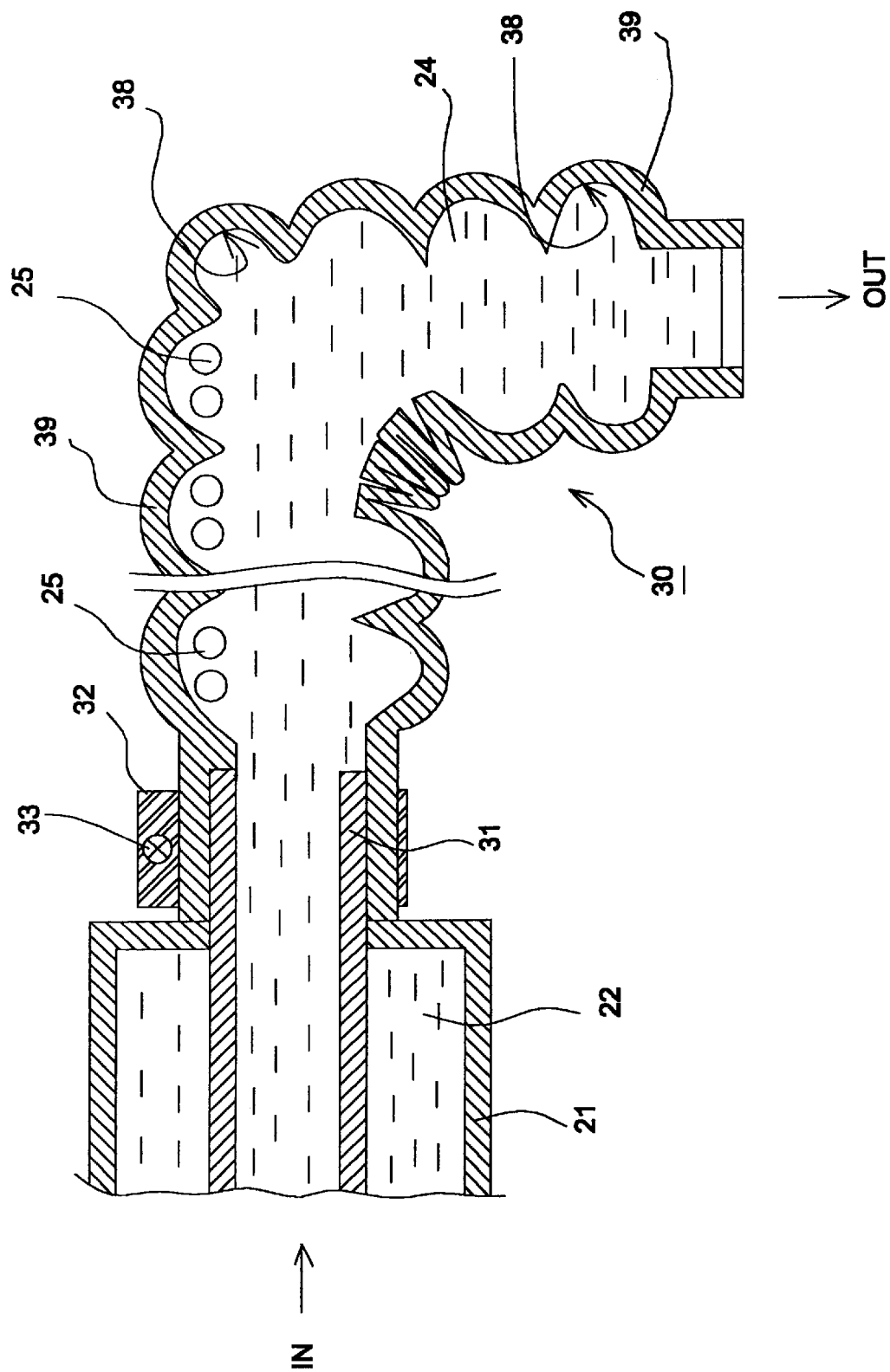
FIG. 4 illustrates an embodiment of the present invention similar to that of FIG. 3, except that pore forming portion 39 includes pores 38 (or furrows) having a round shape, as opposed to the angled type pores or furrows of the corrugated-type structure illustrated in FIG. 3.

FIG. 3 is a sectional view of a viscous fluid discharging mechanism of a viscous fluid discharging apparatus according to the present invention.

A viscous fluid discharging mechanism according to the present invention is constituted such that there is formed connecting portion 31 for connecting discharging gun 30 to the end of temperature adjusting mechanism 21.

Discharging gun 30 includes a sealed joining portion for being sealed and joined to connecting portion 31, an air bubble capturing portion for capturing air bubbles from within the viscous fluid, and a viscous fluid path for moving the viscous fluid to the outlet in a sealed state.

The viscous fluid discharging mechanism is connected to the viscous fluid discharging outlet which is connected to a fluid material filter, a fluid material supplying pump and a fluid material storing container in the upstream direction. The fluid material having a certain degree of viscosity may be used in the manufacture of semiconductor devices. Particularly, the apparatus of the present invention may be used in spreading photoresist.

For the sealed joining portion for sealing and joining the viscous fluid path to the viscous fluid outlet, there is used tightening band 32 which is tightened by means of screw 33. In alternative embodiments, other sealed joining mechanisms such as a threadable joining, a flange joining or the like are used.

Since air bubbles tend to move upward during the moving of the viscous fluid, an air bubble capturing portion is disposed upon the viscous fluid path. This air bubble capturing portion consists of pore forming portion 39 which includes small pores 38.

This air bubble capturing portion may be provided in various forms, and may be conveniently provided in the form of a furrowed tube which performs a role as a viscous fluid path and an air bubble capturer. If the furrowed tube is flexible, it is convenient to move the discharging outlet during the semiconductor manufacturing process.

The shape of the furrows may be an angled type or a round type. Even if furrows are not provided, pockmarks may be provided, so that the air bubbles may be captured within the pits of the pockmarks.

The process of coating photoresist (which is a viscous fluid) on a wafer using a viscous fluid discharging apparatus of the present invention will now be described.

First, a carrier loaded with a plurality of wafers is installed on a wafer supplying portion.

Then the wafers move one by one into the coating portion. A wafer is placed on a vacuum chuck so as for the wafer to be firmly secured by the vacuum chuck, the wafer being rotated or in a still state. The viscous fluid supplying pump is activated so that photoresist is discharged, and that the wafer is coated with photoresist. When photoresist is discharged, if the air bubbles are not completely removed but partly remain to move toward the viscous fluid outlet, or if the joining portion of the viscous fluid is not perfectly sealed so as for air to be introduced to form air bubbles, then the air bubbles are inhibited from moving forward, because the viscous fluid discharging mechanism is provided in the form of a furrowed tube. That is, the originally included air bubbles and newly introduced air bubbles due to a defect in the viscous fluid discharging mechanism tend to float on the viscous fluid during the flow of the viscous fluid due to the difference in specific gravity between the viscous fluid and the air bubbles. Therefore, the furrowed spaces of the furrowed tube tend to capture floating air bubbles 25, and only viscous fluid 24 with air bubbles removed is discharged.

The furrowed viscous fluid discharging mechanism may be detached from the joined portion, and disassembled, assembled and replaced. Therefore, it may be periodically cleaned, and accordingly, it is very convenient.

According to the present invention as described above, the viscous fluid discharging mechanism finally removes the air bubbles from the viscous fluid prior to discharge, with the result that coating defects are reduced. Further, the viscous fluid discharging mechanism may be disassembled, assembled and replaced after being used for a certain period of time, and, therefore, the formation of particles may be inhibited. Further, the phenomenon of the viscous fluid discharging mechanism being clogged is improved, and the undesirable variation in the discharge rate and discharge pressure also are improved.

Although various preferred embodiments of the present invention have been disclosed for illustrative purposes, those skilled in the art will appreciate that various modifications, additions and/or substitutions are possible without departing from the scope and spirit of the present invention as disclosed in the claims.

What is claimed is:

1. An apparatus discharging a viscous fluid in a semiconductor manufacturing process, comprising:
    a fluid storage container holding said viscous fluid;
    a fluid supply pump, wherein the supply pump pumps the viscous fluid from the storage container;
    a fluid filter, wherein the fluid filter is coupled to the fluid supply pump and filters impurities and air bubbles contained in the viscous fluid; and
    a fluid discharging mechanism comprising a temperature adjusting mechanism, a connecting portion and a discharge gun, wherein the fluid discharging mechanism is coupled to the fluid filter, wherein the connecting portion connects the temperature adjusting mechanism to the discharging gun, wherein the temperature adjusting mechanism adjusts a temperature of the viscous fluid flowing through the discharging gun;
    wherein the discharging gun further comprises:
        a sealed joining portion for removably sealing and joining the discharging gun to the connecting portion;
        said means for capturing air bubbles comprising a furrowed tube capturing air bubbles from within the viscous fluid; and
        a fluid path moving the viscous fluid to an outlet of the discharging gun;
    wherein the discharging gun may be removed, wherein the means for capturing air bubbles may be cleaned.

2. The apparatus of claim 1, wherein the fluid discharging mechanism is adapted to discharge the viscous fluid onto a semiconductor substrate.

3. The apparatus of claim 1, wherein the viscous fluid is photoresist.

4. A viscous fluid discharging mechanism discharging viscous fluid in a semiconductor manufacturing process, comprising:
    a viscous fluid temperature adjusting mechanism;
    a sealed joining portion sealed and joined to an outlet of the viscous fluid temperature adjusting mechanism; and
    a viscous fluid path removably connected to the sealed joining portion moving the viscous fluid to a viscous fluid discharging outlet in a sealed state, the viscous fluid path having
        a means for capturing air bubbles in the viscous fluid path comprising a furrowed tube capturing air bubbles from within the viscous fluid;
    wherein the viscous fluid path may be removed, wherein the means for capturing air bubbles may be cleaned.

5. The viscous fluid discharging mechanism of claim 4, wherein:
    the sealed joining portion includes a tightening band for removably joining the viscous fluid path to the viscous fluid discharging outlet; and
    the means for capturing air bubbles comprises a space forming portion on an upper portion of the viscous fluid path to form a plurality of spaces capturing air bubbles.

6. The viscous fluid discharging mechanism of claim 5, wherein the plurality of spaces of the means for capturing air bubbles have entrances that are wider than interiors of the plurality of spaces.

7. The viscous fluid discharging mechanism of claim 4, wherein the means for capturing air bubbles and the viscous fluid path comprise a corrugated structure.

8. The viscous fluid discharging mechanism of claim 4, wherein the furrowed tube is flexible.

9. The viscous fluid discharging mechanism of claim 4, wherein furrows of the furrowed tube have an angled shape.

10. The viscous fluid discharging mechanism of claim 4, wherein the furrows of the furrowed tube have a round shape.

11. A viscous fluid discharging apparatus discharging viscous fluid in a semiconductor manufacturing process, comprising:

a viscous fluid storage container holding said viscous fluid;

a pump pumping the viscous fluid from the viscous fluid storage container;

a filter coupled to the pump filtering the viscous fluid;

a viscous fluid discharging mechanism coupled to the filter receiving filtered viscous fluid, the viscous fluid discharging mechanism having a connecting portion removably coupling to a means for capturing air bubbles said means for capturing air bubbles having an outlet discharging the viscous fluid, wherein the means for capturing air bubbles comprises a furrowed tube shaped to have an upper portion capturing air bubbles in furrows of the furrowed tube, wherein the viscous fluid discharging mechanism may be removed, wherein the means for capturing air bubbles may be cleaned.

12. The apparatus of claim 11, wherein the viscous fluid is photoresist.

13. The apparatus of claim 11, wherein the viscous fluid discharging mechanism is adapted to discharge viscous fluid onto a substrate.

14. The apparatus of claim 11, wherein the viscous fluid discharging mechanism is adapted to discharge viscous fluid onto a semiconductor substrate.

15. The apparatus of claim 11, wherein the viscous fluid flows through a path prior to being received by the viscous fluid discharging mechanism, wherein the apparatus further comprises a temperature adjusting mechanism coupled to the path, wherein the temperature adjusting mechanism adjusts the temperature of the viscous fluid prior to being discharged by the viscous fluid discharging mechanism.

16. The apparatus of claim 11, wherein the furrows comprise angled spaces, round spaces or pits.

* * * * *